US 7,058,535 B2
Jun. 6, 2006

(12) United States Patent
Chenoweth et al.

(54) TEST SYSTEM FOR INTEGRATED CIRCUITS WITH SERDES PORTS

(75) Inventors: Gordon Edward Chenoweth, Portland, OR (US); Marc P. Loranger, Livermore, CA (US); Steven Robert Payne, Hillsboro, OR (US); James Kaylor Larson, Portland, OR (US); Patricia Renee Justice, Portland, OR (US)

(73) Assignee: Credence Systems Corporation, Milpitas, CA (US)

( * ) Notice: Subject to any disclaimer, the term of this patent is extended or adjusted under 35 U.S.C. 154(b) by 48 days.

(21) Appl. No.: 10/778,463

(22) Filed: Feb. 12, 2004

(65) Prior Publication Data

US 2005/0182588 A1    Aug. 18, 2005

(51) Int. Cl.
*G06F 19/00* (2006.01)
(52) U.S. Cl. ..................................... 702/118
(58) Field of Classification Search ................ 702/118, 702/182, 108, 117, 120, 122, 183, 185; 714/700, 714/724
See application file for complete search history.

(56) References Cited

U.S. PATENT DOCUMENTS

| 6,694,462 B1* | 2/2004 | Reiss et al. ................. 714/724 |
| 2003/0105607 A1* | 6/2003 | Jones et al. ................. 702/121 |
| 2005/0044463 A1* | 2/2005 | Frisch ........................ 714/738 |

* cited by examiner

*Primary Examiner*—John Barlow
*Assistant Examiner*—C. D. Khuu
(74) *Attorney, Agent, or Firm*—Daniel J. Bedell; Smith-Hill and Bedell (57) ABSTRACT

A system for testing an integrated circuit device under test (DUT) communicating though synchronous digital signals and through a high speed serialization/de-serialization (serdes) bus includes a serdes interface circuit for communicating with the DUT via the serdes bus and an integrated circuit (IC) tester for communicating with the DUT and with the serdes interface circuit via digital signals. State changes in the digital signals are synchronized to a clock signal within the IC tester. The serdes interface circuit receives instructions from the IC tester via at least one of the digital signals and responds to the instructions by transmitting data to the DUT via the serdes bus using appropriate serdes protocol, by receiving and storing data transmitted by the DUT via the serdes bus, and by thereafter forwarding the stored data to the IC tester via at least one of the digital signals.

19 Claims, 5 Drawing Sheets

TEST SYSTEM FOR INTEGRATED CIRCUITS WITH SERDES PORTS

BACKGROUND OF THE INVENTION

1. Field of the Invention

The invention relates in general to systems for testing integrated circuits and in particular, to a system for functionally testing the logic of an integrated circuit that communicates through both synchronous digital signals and through one or more high speed asynchronous serialization/de-serialization (serdes) buses.

2. Description of Related Art

Digital integrated circuits (ICs) typically communicate through digital signals in which edges are synchronized to edges of clock signals. Conventional digital IC testers typically employ a separate channel to access each pin of an IC device under test (DUT), and each channel may either send a test signal to a DUT pin or sample a DUT output signal produced at a DUT pin. The tester organizes the test into a succession of test cycles a pattern generator in each channel generates a multiple-bit data word (a "vector") before the start of each test cycle encoded to indicate whether the channel is, for example, to drive a signal high or low during the test cycle or is to sample the DUT output signal to determine whether it is of some expected state. The vector will also indicate the times during each test cycle at which the state change or sampling events are to occur and may indicate an expected state of the DUT output signal sample. When the IC tester supplies the DUT with the clock signals that the DUT uses to control the timing of signal edges it produces, then all of the state changes in each DUT output signal should occur at predictable times relative to those clock signals if the DUT is operating properly. Therefore, when a test engineer develops the vector sequences for controlling channel behavior during a test, the test engineer will be able to control the DUT's timing through the vector sequences controlling its input clock signal(s), and will be able to control the timing of the DUT's input data signals through vector sequences controlling those data signals. This enables the test engineer to predict when the DUT's output signals will change state, if the DUT operates as expected, thereby enabling the test engineer to design the vector sequences controlling the timing with which the DUT's output signals are sampled during each test cycle and indicating expected states of those signals.

Many ICs now include one or more ports that communicate through serialization/deserialization "serdes" buses. In "source synchronized" serdes communications systems, a transmitting IC sends a clock signal to the receiver along with the serial data signal to tell the receiver when to sample the data signal. In "embedded clock" serdes communication systems, the transmitter does not send a clock signal with the data signal and the receiver must recover the transmitter's clock signal (i.e., determine he the phase and frequency of the transmitter's clock signal) by monitoring the timing of edges of the incoming data signal. In either case, the receiving IC requires time to synchronize its receiving clock signal to the transmitting IC's clock signal before the transmitting IC begins transmitting data. The amount of time required is variable and unpredictable.

Although we might like to use an IC tester channel to directly sample a serdes signal transmitted by the DUT, a conventional IC tester channel is not adapted to synchronize its sampling clock to the DUT's clock signal when the DUT and tester clock signals are independent and of potentially different frequencies and phases. Also, when multiple serdes systems operate in parallel to produce higher data rates, synchronization requires aligning the phase of the multiple serdes signals to align not only timing but also the data bits. Such alignment is accomplished during an asynchronous training sequence, an interaction between the transmitter and the receiver occurring in a manner that is not deterministic from DUT to DUT.

A serdes signal that is synchronized to a clock signal will exhibit some amount of "jitter" in that the timing of its edges will continuously vary with respect to the timing of edges of the clock signal. When testing a DUT receiving a serdes signal it is desirable to test whether it can tolerate some specified amount of jitter in that signal and to measure the jitter in its output signal to determine whether it is within acceptable limits.

What is needed is an IC tester architecture that allows an IC tester to carry out a functional test on a DUT that communicates through tester-synchronous, deterministic digital signals as well as through source-synchronous serdes buses. The IC tester should also be able to conduct jitter testing on an IC port.

SUMMARY OF THE INVENTION

A system in accordance with the invention performs a functional logic test on an integrated circuit device under test (DUT) that communicates both through synchronous digital signals and through one or more high-speed serialization/deserialization (serdes) buses. A test system in accordance with one embodiment of the invention includes a serdes interface circuit for communicating with the DUT via the serdes bus and an integrated circuit (IC) tester for communicating with the DUT and with the serdes interface circuit via digital signals. State changes in the digital signals are synchronized to a clock signal within the IC tester so that they occur at predicable times. The serdes interface The claims appended to this specification particularly point out and distinctly claim the subject matter of the invention. However those skilled in the art will best understand both the organization and method of operation of what the applicant(s) consider to be the best mode(s) of practicing the invention by reading the remaining portions of the specification in view of the accompanying drawing(s) wherein like reference characters refer to like elements.

DETAILED DESCRIPTION OF THE INVENTION

The present invention relates to a system for testing integrated circuits (ICs) having high-speed serialization/deserialization (serdes) ports. While the specification describes at least one exemplary embodiment of the invention considered a best mode of practicing the invention, those of skill in the art will appreciate that other modes of practicing the invention are possible.

Figure 1:
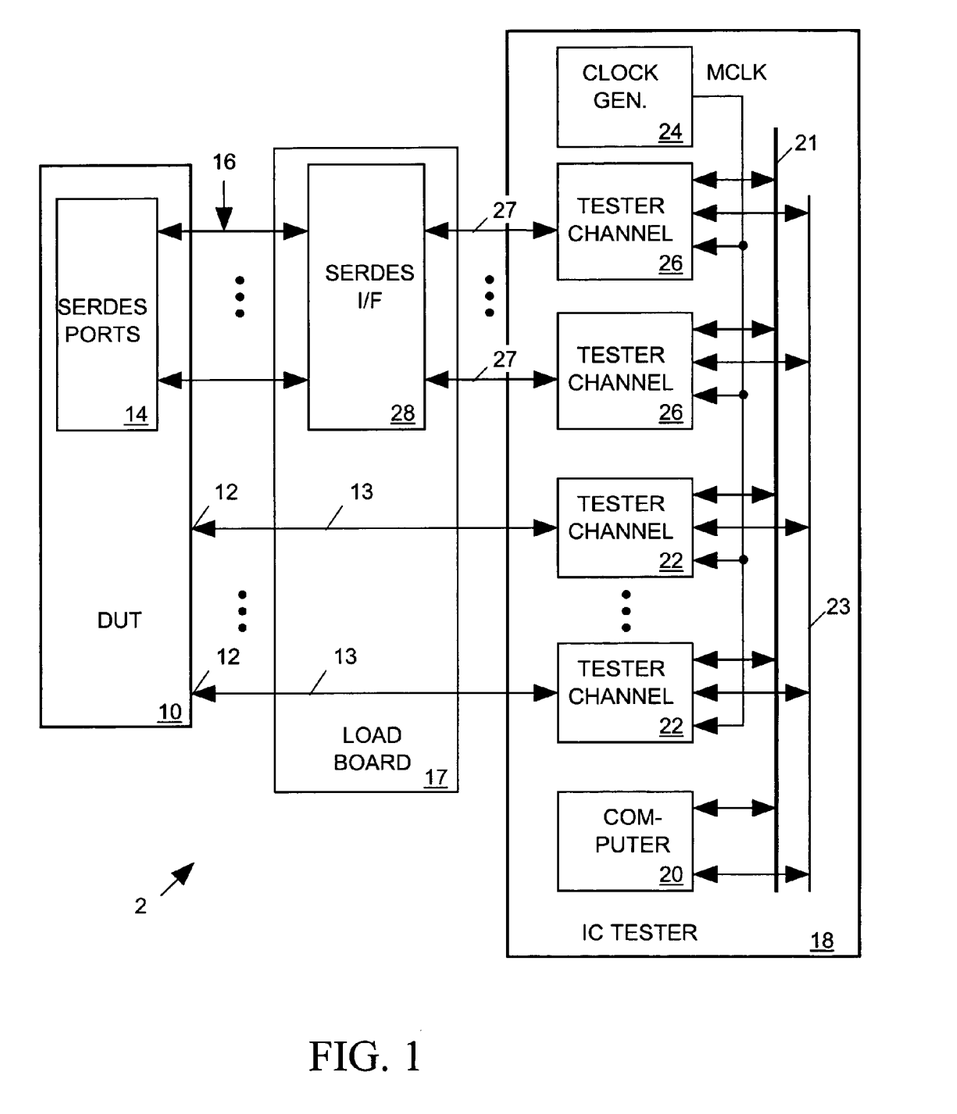
FIG. 1 illustrates in block diagram form an integrated circuit tester in accordance with an exemplary embodiment of the invention.

FIG. 1 illustrates an example test system 2 in accordance with the invention for testing an IC device under test (DUT) 10 including a set of digital input/output (IO) ports 12 and one or more serdes ports 14 for communicating through high speed serdes buses 16. A load board 17 provides signal paths between DUT 10 and an IC tester 18 to enable tester 18 to test DUT 10. IC tester 18 includes a set of conventional tester channels 22, each connected to a separate one of the DUT's IO ports 12.

Tester 18 organizes the test into a succession of test cycles with the timing of each test cycle being controlled by a master clock signal MCLK a clock signal generator 24 supplies to each channel 22. A computer 20 communicating with each tester channel through a conventional computer bus 21 and a control bus programs a pattern generator within each tester channel 22 to generate a data word (a "vector") before the start of each test cycle. Each vector is encoded to indicate whether the channel is, for example, to drive a signal high or low during the next test cycle or is to sample the DUT output signal to determine whether it is of some expected state. The vector will also indicate the time during each test cycle at which the state change or sampling events are to occur and may indicate an expected state of the DUT output signal sample. One or more of channels 22 will supply DUT 10 with the clock signals derived from the master clock signal MCLK that the DUT uses to control the timing of signal edges in the digital signals it produces. All of the signal state changes at each DUT output port 12 will occur at predictable times relative to the MCLK signal, if the DUT is operating properly. Thus, state changes in signals 13 will occur at predictable times during each test cycle. when a tester channel 22 detects that a DUT output signal fails to be of an expected state when sampled during any given test cycle, it records data indicating the cycle in which the error occurred in an internal data acquisition memory. Computer 20 reads the data in the acquisition memory of each tester channel 22 at the end of the test to determine whether DUT 10 is defective.

Tester 18 includes another set of conventional tester channels 26, similar to channels 22, for communicating with a serdes interface circuit 28 mounted on load board 17. Serdes interface circuit 28 communicates with the DUT's serdes ports 14 during the test. During some cycles of the test, the vector sequences, generated by the pattern generators in tester channels 26 tell them to transmit programming data to serdes interface circuit 28. That programming data later tells serdes interface circuit to communicate with serdes ports 14 using the appropriate serdes bus protocol and to store data received via serdes buses 16 in an internal memory. Thereafter serdes interface circuit 28 reads the data out of its internal memory and forwards it to tester channels 26 which determine whether the data is of expected states as indicated by the channel's vector sequences.

serdes interface circuit 28 communicates with tester channel 26 via signal paths 27 using signals that are synchronized to a clock signal derived from the MCLK signal and supplied by one of tester channels 26. All data transfers between tester channels 26 and serdes interface 28 therefore occur at predictable times during the test. The signals passing over serdes buses 16 between serdes ports 14 and serdes interface circuit 28 are initially not synchronized to the MCLK signal and therefore occur at unpredictable times relative to the start of each test cycle. However after a training period in which serdes interface circuit 28 and serdes ports 14 have established a communication link and have synchronized their clock signals and data, data communications through the serdes buses 16 can be synchronized to the MCLK signal thereby enabling tester 18 and serdes interface circuit 28 to functionally test the DUT's synchronous IC signals 13 and its serdes ports 14 concurrently.

During the training period, tester channels 22 temporarily refrain from carrying out any more test cycles and keep their output signals at their present states. At the end of the training period, serdes interface circuit 28 transmits a READY signal back to one of tester channels 26 to indicate that serdes communication is now established. That tester channel 26 then sends a RESUME signal over control bus 23 to all tester channels 22 telling them to concurrently resume testing the DUT, and sends a START command to serdes interface circuit 28. The START command tells serdes interface circuit 28 to begin executing its stored program controlling how it communicates with DUT 10 via serdes buses 16 during the remainder of the test. Since the START command is synchronized to the tester's master clock MCLK, so too is the start of serdes communication.

Figure 2:
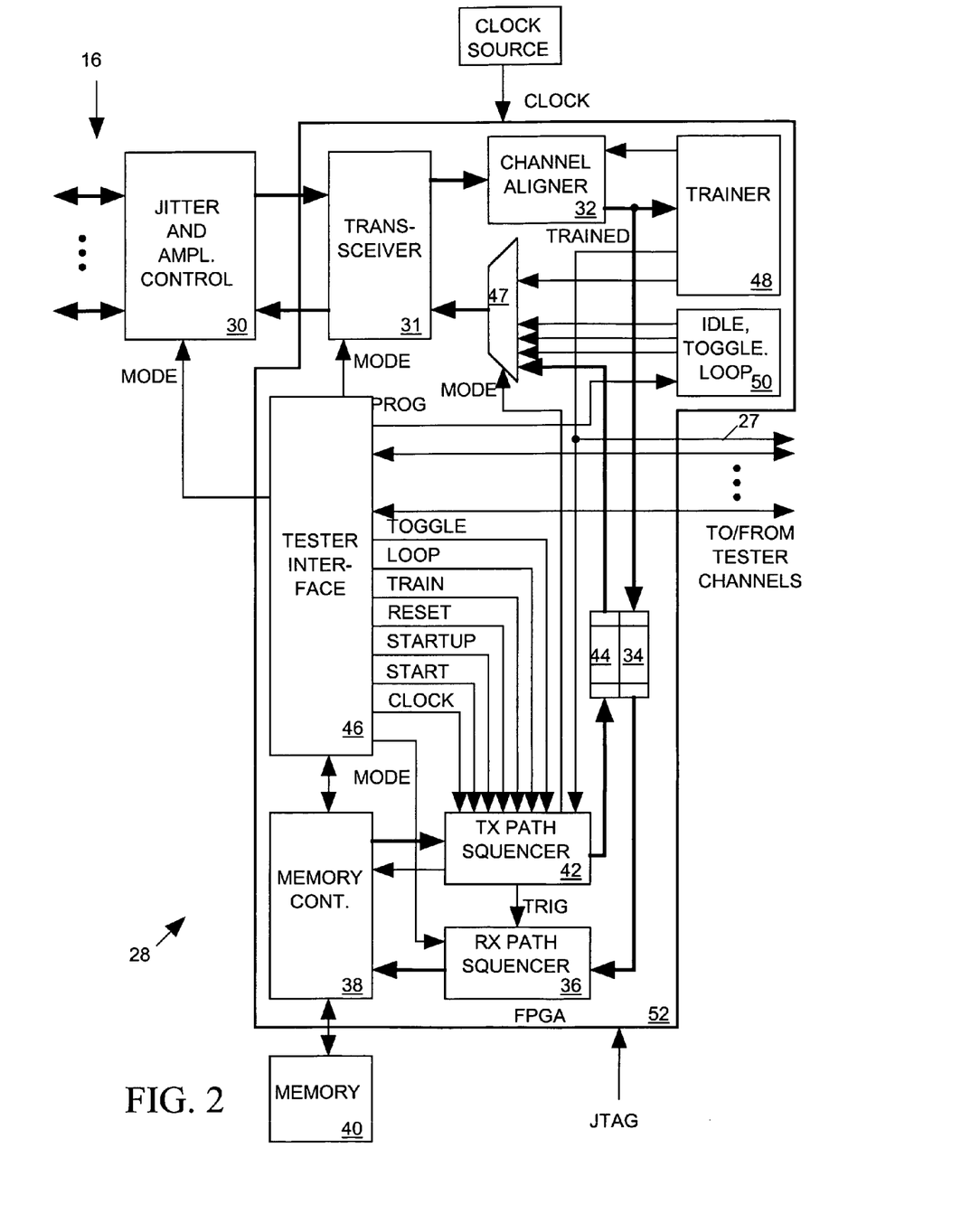
FIG. 2 illustrates the serdes interface circuit of FIG. 1 in more detailed block diagram form.

FIG. 2 illustrates serdes interface 28 of FIG. 1 in more detailed block diagram form. A jitter and amplitude control circuit 30 links serdes buses 16 to a transceiver 31. Circuit 30 normally passes serdes signals unchanged, but during a jitter test to determine the DUT's tolerance to jittery signals, circuit 30 adds a controlled amount of jitter to the outgoing serdes signal. Circuit 30 can also be programmed by input mode data to increase or decrease the amplitude of the outgoing serdes signal to enable the system to test the DUT's tolerance to variation in signal amplitude.

Transceiver 31 samples the incoming serdes signals and passes the serial data stream it recovers from each signal to a channel aligner circuit 32. When an IC transmits data to another IC through a serdes bus, the transmitter IC typically encodes an 8-bit parallel data byte into, for example, a 10-bit code and then forwards that 10-bit code to the receiver IC via a serial bus. The 5B/10B encoding allows the transmitter to insert various control codes into the data stream, for example, to indicate the start or end of a data transmission. The control codes also help channel aligner 32 to determine the positions of the 10-bit codes within the serial data stream during the training period. Channel aligner 37 converts each serial bit stream transceiver 31 produces into a stream of 10-bit bytes and passes each byte to a first-in/first-out (FIFO) buffer 34. FIFO buffer 34 shifts each byte out to an RX path sequencer circuit 36, which forwards selected bytes to a memory controller 38. Memory controller 38 stores the bytes sequentially in a memory 40. In one mode of operation, RX path sequencer 36 converts the 10-bit 8B/10B encoded data bytes back into their original 8-bit byte form before forwarding them to memory controller 38 for storage in memory 40.

During some cycles of the test, tester channels 26 transmit instructions to a tester interface circuit 46, which loads the instructions into memory 40 via memory controller 38. Thereafter, when serdes interface circuit 28 is to communicate with the DUTs serdes ports 14 (FIG. 1), a TX path sequencer circuit 42 sequentially reads the instructions out of memory 40 and executes them. Some instructions tell sequencer 42 to transmit an 8B/10B encoded byte through a FIFO buffer 44 and a multiplexer 47 to transceiver 31. Transceiver 31 serially forwards each 10-bit byte to the DUT's serdes port 14.

Figure 3:
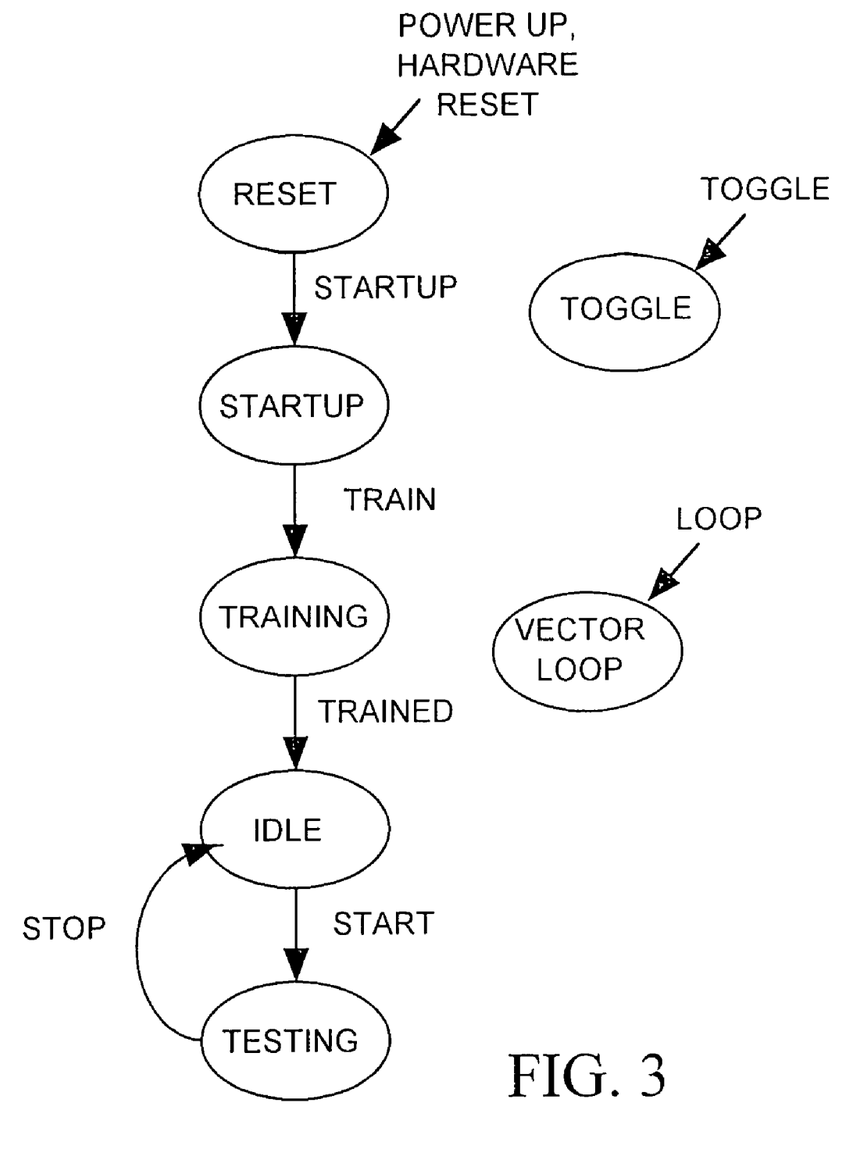
FIG. 3 is a state diagram illustrating behavior of the TX path sequencer of FIG. 2.

FIG. 3 is a state diagram illustrating the behavior of TX path sequencer 42 of FIG. 2. Sequence 42 enters into a RESET mode on system power up or on a hardware reset. In the RESET mode, sequencer 42 waits for a STARTUP signal from tester interface 46 (FIG. 2) supplied in response to a STARTUP command from tester channels 26 conveying the command. The STARTUP signal tells TX path sequencer 42 to enter into a STARTUP state wherein it waits for transceivers 31 to synchronize their internal sampling clocks to the DUT's transmit clocks. Thereafter, sequencer 42 enters into a TRAINING state in response to a TRAIN command from tester channels 26 that is decoded by interface 46. In this state sequencer 42 switches multiplexer 47 so that it passes a training sequence generated by a trainer circuit 48 as the outgoing data transceiver 31 to the DUT. The DUT sends a similar training sequence back to transceiver 31, which forwards the training sequence to channel aligner 32. Training circuit 48 monitors the sequence of 10-bit bytes produced by channel aligner 32 and adjusts the channel aligner so that it correctly chooses the starting and ending bits of each 10-bit byte within the serial bit stream arriving from transceiver 31. A trainer circuit with the DUT carries out a similar function. When both local and remote trainer circuits have trained their local channel aligners, trainer 48 sends a TRAINED signal to sequencer 42 causing it to enter an IDLE state as shown in FIG. 3. One of tester channels 26 monitors the TRAINED signal and when it detects that the TRAINED signal is true it will signal channels 22 via bus 23 that they may resume the test sequence. In its IDLE state, sequencer 42 switches multiplexer 47 to forward a continuous sequence of idle codes from pattern generator 50 to transceiver 31, which then forwards the sequence serially to the DUT via the serdes bus 16. The idle codes tell the DUT that the serdes communication link is operative but that no data is currently being transmitted. The DUT will transmit a similar sequence of idle codes to transceiver 31 when it is not otherwise transmitting data.

TX path sequencer 42 of FIG. 2 will remain in the IDLE state (FIG. 3) until it receives a START command from tester channels 26 via tester interface circuit 46 telling sequencer 42 to enter a TESTING state. In the TESTING state the interaction between the DUT 10 and the tester are synchronous and deterministic. In the TESTING state, sequencer 42 continuously reads and executes instructions out of memory 40. As mentioned above, some of those instructions will tell sequencer 42 to forward a byte to transceiver 31. Other instructions may tell the TX path sequencer 42 to send a TRIG signal to RX path sequencer 36 telling it to acquire a byte from FIFO buffer 34 and to store it in memory 40. Tester interface 46 forwards a clock signal (CLOCK) supplied by tester channels 26 to TX path sequencer 42 for timing the sequencer's activities. Thus, when TX path sequencer 42 is in it its TESTING mode, it begins reading and executing instructions in memory 40 at a predictable time relative to edges of the tester master clock signal MCLK. This enables serdes interface circuit 28 and tester channels 22 to synchronize their communications with DUT 10 so that the system can test the manner in which the DUT's digital 10 signals 13 and serdes signals 16 interact.

TX path sequencer 42 also has a TOGGLE state it can enter from any other state in response to a TOGGLE command from tester channels 26 via tester interface 46. In the TOGGLE state, sequencer 42 sets multiplexer 47 to select a toggle sequence produced by pattern generator 50, which causes transceiver 31 to transmit an alternating sequence of 1's and 0's (101010 . . . ) to the DUT on each serdes bus.

TX path sequencer 42 also has a LOOP state that it can enter from any other state in response to a LOOP command from tester channels 26 via tester interface 46. In the LOOP state, sequence 42 set multiplexer 46 to select a foreword a repetitive sequence produced by pattern generator 50 to transceiver 31.

Channels 26 can send programming data to tester interface circuit 46 telling it to set mode control data input to circuit 30 controlling whether it adds jitter to the outgoing serdes signals, controlling the amplitude and frequency of the jitter, and controlling the amount by circuit 30 increases of decreases the amplitude of the outgoing serdes signals.

Other programming data from channels 26 tells tester interface circuit 46 to send mode control data input to transceiver 31 telling it whether it is to operate in a source synchronized mode in which it synchronizes sampling of incoming serdes signal to a clock signal supplied as input to transceiver 31 from DUT 10 or in an embedded clock mode in which it derives the DUT's clock signal from the incoming serdes data signals.

Tester interface 46 also forwards programming data from channels 26 to pattern generator 50 that defines the nature of the repetitive byte pattern it is to generate during the LOOP mode of operation.

MODE data supplied by tester interface 46 in response to commands from tester channels 26 also tells RX path sequencer 36 which kinds of data bytes it reads out of FIFO buffer 34 are to be stored in memory 40. For example RX path sequencer 36 may store every byte it reads out of FIFO buffer 34 into memory 40, may store only bytes that are not idle codes, or may store only data bytes that are not 8B/10B control codes inserted into the data stream.

In the preferred embodiment of the invention, devices 31–38 and 42–50 are suitably implemented by a field programmable gate array (FPGA) 52 mounted on load board 17 of FIG. 1 and clocked by an oscillator 54 also mounted on the load board. Memory 40 is suitably an SRAN mounted on load board 17. A JTAG bus or other source of data can be used to load boot-programming data into FPGA 52. In alternative embodiments of the invention, the function of FPGA 52 can be implemented by one or more application specific integrated circuits (ASICS)

Figure 4:
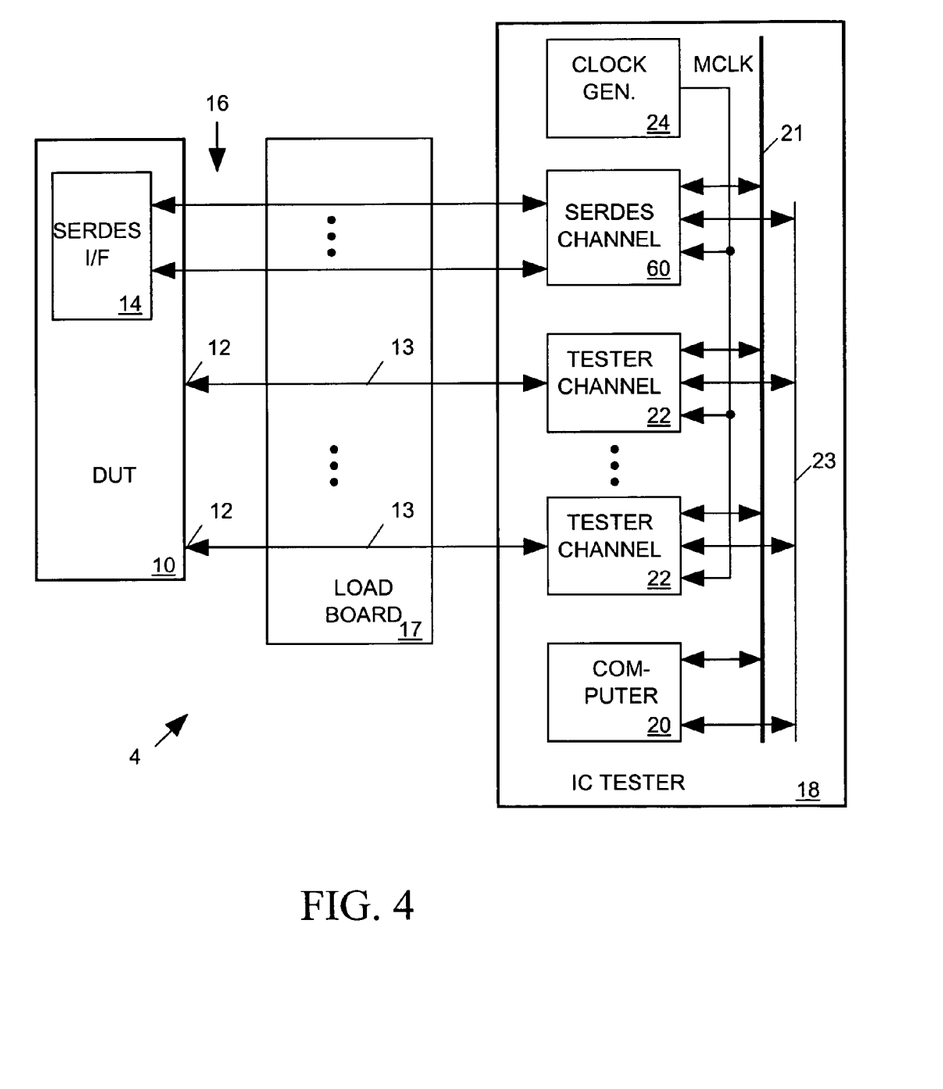
FIG. 4 illustrates in block diagram form an integrated circuit tester in accordance with another exemplary embodiment of the invention.

FIG. 4 depicts a test system 4 in accordance with an alternative embodiment of the invention for testing a DUT 10 including one or more serdes ports 14. This embodiment of the invention is generally similar to system 2 of FIG. 1, except that a dedicated serdes channel 60 included inside tester 18 replaces the load board-mounted serdes interface circuit 28 of FIG. 1 as well as the general purpose tester channels 26 that communicate with serdes interface circuit 28.

Figure 5:
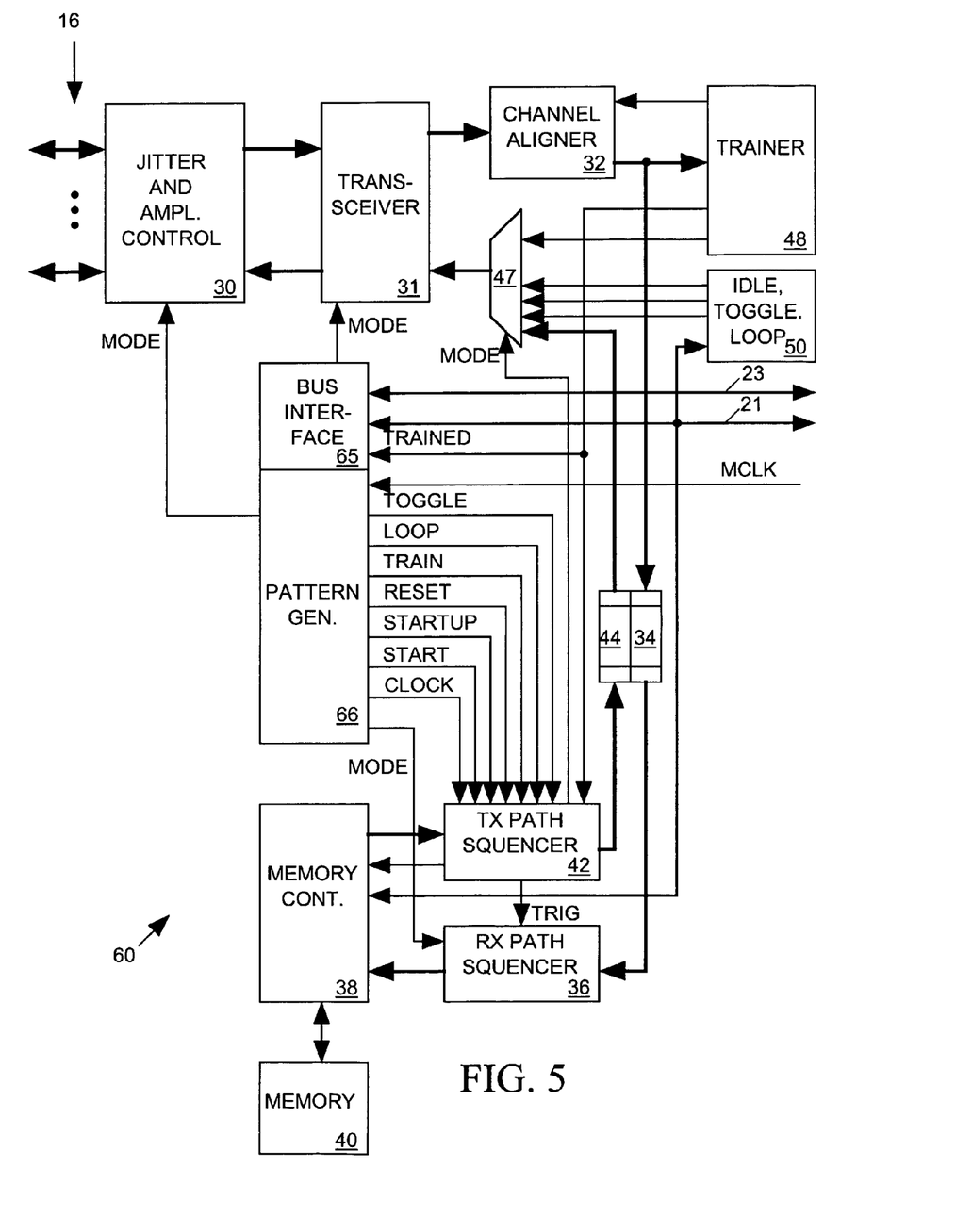
FIG. 5 illustrates the serdes channel of FIG. 4 in more detailed block diagram form.

FIG. 5 depicts serdes channel 60 in more detailed block diagram form. Serdes channel 60 includes many blocks that are similar in nature to similarly numbered blocks of serdes interface circuit 28 of FIG. 2. However, the tester interface circuit 46 of FIG. 2 has been replaced in serdes channel 60 with a bus interface circuit 65 communicating with the host computer 20 and other channels via buses 21 and 23 and pattern generator 66 for controlling the TOGGLE, LOOP, TRAIN, RESET, STARTUP START and CLOCK signals and for appropriately setting the mode control data inputs to blocks 30 and 42 during various cycles of the test in response to edges of the MCLK signal marking the start of each test cycle. Computer 20 of FIG. 4 programs pattern generator 66 before the start of a test with instructions sent via bus 21 and bus interface 65. Bus interface 65 sets the clocking mode of transceiver 31 in response to data received from computer 20 via bus 23 and signals and responds to the TRAINED signal output of trainer 48 by signaling channels 22 that they may resume their test sequences. Computer 20 also directly programs the loop pattern into pattern generator 50 via programming data supplied over bus 21 and directly read and write accesses memory 40 though bus 21 and memory controller 38.

The foregoing specification and the drawings depict exemplary embodiments of the best mode(s) of practicing the invention, and elements or steps of the depicted best mode(s) exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

The invention claimed is:

1. A method for testing an integrated circuit (IC) device under test (DUT) that receives an input serdes signal and an input digital signal and that transmits an output serdes signal and an output digital signal, the method comprising the steps of:
   a. providing signal paths interconnecting a serdes interface circuit, an IC tester and the DUT;
   b. programming the serdes interface circuit to respond to a command by generating and transmitting the input serdes signal to the DUT via at least one of the signal paths, wherein the input serdes signal represents a first data sequence; and
   c. using the IC tester to send the command to the serdes interface circuit via at least one of the signal paths.

2. The method in accordance with claim 1 wherein the input serdes signal influences a behavior of the DUT's digital output signal, wherein the IC tester receives the digital output signal via at least one of the signal paths, and wherein the method further comprising the step of:
   d. using the IC tester to monitor the digital output signal to determine whether it behaves in an expected manner.

3. The method in accordance with claim 2 further comprising the step of:
   e. programming the serdes interface circuit to provide a controlled amount of jitter in the generated first serdes signal.

4. The method in accordance with claim 1 wherein step b comprises using the IC tester to transmit program instructions to the serdes interface circuit for programming the serdes interface circuit to generate the input serdes signal representing the first data sequence.

5. The method in accordance with claim 1 wherein the serdes interface circuit receives the serdes output signal via at least one of said signal paths, the method further comprising the step of:
   d. programming the serdes interface circuit to process the output serdes signal to generate digital data representing a second data sequence.

6. The method in accordance with claim 5 further comprising the steps of:
   e. causing the serdes interface circuit to generate and transmit to the IC tester, via one of the signal paths, a digital signal representing the digital data; and
   f. using the IC tester to monitor the digital signal to determine whether the digital signal behaves in an expected manner.

7. The method in accordance with claim 1 further comprising the step of:
   d. programming the serdes interface circuit to provide a controlled amount of jitter in the generated input serdes signal.

8. A method for testing an integrated circuit (IC) device under test (DUT) that receives an input serdes signal and an input digital signal and that transmits an output serdes signal and an output digital signal, the method comprising the steps of:
   a. providing signal paths interconnecting a serdes interface circuit, an IC tester and the DUT;
   b. programming the series interface circuit to receive the output serdes signal from the DUT via at least one of the signal paths, wherein the output series signal represents a first data sequence and to process the output serdes signal to send at least one data signal representing the first data sequence to the IC toster via at least one of the signal paths; and
   c. using the IC tester to monitor the at least one data signal no determine whether it behaves in an expected manner.

9. The method in accordance with claim 8 wherein the DUT's input digital signal influences its output serdes signal, and wherein the method further comprises the step of:
   d. using the IC tester to generate and transmit the input digital signal to the DUT via one of the signal paths.

10. The method in accordance with claim 8 wherein step b comprises using the IC tester to generate and transmit to the serdes interface circuit, via at lease one of the signal paths, programming signals representing instructions for programming the serdes interface circuit.

11. An apparatus for testing an integrated circuit (IC) device under test (DUT) that receives an input serdes signal and an input digital signal and that transmits an output serdes signal and an output digital signal, the apparatus comprising the steps of:
   a plurality of signal paths;
   a serdes interface circuit for responding to a signal representing a command by generating and transmitting the input serdes signal to the DUT via at least one of the signal paths, wherein the input serdes signal represents a first data sequence; and
   an IC tester for sending the signal representing the command to the serdes interface circuit via at least one of the signal paths.

12. The apparatus in accordance with claim 11
   wherein the input serdes signal influences a behavior of the DUT's digital output signal,
   wherein the IC tester receives the digital output signal via at least one of the signal paths, and
   wherein the IC tester to monitors the digital output signal to determine whether it behaves in an expected manner.

13. The apparatus in accordance with claim 12 wherein the serdes interface circuit provides an amount of jitter in the generated first serdes signal controlled by programming data supplied as input to the serdes interface circuit.

14. The apparatus in accordance with claim 11 wherein the IC tester transmits program instructions to the serdes interface circuit for programming the serdes interface circuit to generate the input serdes signal representing the first data sequence.

15. The apparatus in accordance with claim 11
  wherein the serdes interface circuit receives the serdes output signal via at least one of said signal paths, and
  wherein the serdes interface circuit processes the output serdes signal to generate digital data representing the second data sequence.

16. The apparatus in accordance with claim 15
  wherein the serdes interface generates and transmits to the IC tester, via one of the signal paths, a digital signal representing the digital data; and
  wherein the IC tester monitors the digital signal to determine whether the digital signal behaves in an expected manner.

17. The apparatus in accordance with claim 11 wherein the serdes interface circuit provides an amount of jitter in the generated first serdes signal supplied as input to the serdes interface circuit.

18. An apparatus for testing an integrated circuit (IC) device under test (DUT) that receives an input serdes signal and an input digital signal and that transmits an output serdes signal and an output digital signal, the apparatus comprising:
  a plurality of signal paths;
  a serdes interface circuit for receiving the output serdes signal from the DUT via at least one of the signal paths, wherein the output serdes signal represents a first data sequence, and for processing the output serdes signal to generate at least one data signal representing the first data sequence,
  an IC tester for receiving the at least one data signal from the serdes interface circuit via at least one of the signal paths; and for monitoring the at least one data signal to determine whether it behaves in an expected manner.

19. The apparatus in accordance with claim 18 wherein the DUT's input digital signal influences its output serdes signal, and wherein IC tester generates and transmits the input digital signal to the DUT via one of the signal paths.

\* \* \* \* \*